US009024337B2

(12) United States Patent
Fujii et al.

(10) Patent No.: US 9,024,337 B2
(45) Date of Patent: May 5, 2015

(54) DISPLAY PANEL AND DISPLAY UNIT

(71) Applicant: Sony Corporation, Tokyo (JP)

(72) Inventors: Masaru Fujii, Kanagawa (JP); Masami Okita, Tokyo (JP); Akiyoshi Aoyagi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/143,440

(22) Filed: Dec. 30, 2013

(65) Prior Publication Data

US 2014/0203310 A1 Jul. 24, 2014

(30) Foreign Application Priority Data

Jan. 18, 2013 (JP) ................................ 2013-007789

(51) Int. Cl.
*H01L 27/15* (2006.01)
*G09F 9/33* (2006.01)

(52) U.S. Cl.
CPC ....................................... *G09F 9/33* (2013.01)

(58) Field of Classification Search
CPC ................................. H01L 27/15; G09F 9/33
USPC ........................................................... 257/89
See application file for complete search history.

(56) References Cited

U.S. PATENT DOCUMENTS 6,661,030 B2 * 12/2003 Komoto et al. ................ 257/98
8,629,472 B2 * 1/2014 Seo et al. ........................ 257/98

FOREIGN PATENT DOCUMENTS

JP 2009-272591 11/2009

* cited by examiner

*Primary Examiner* — Roy Potter
*Assistant Examiner* — Paul Patton
(74) *Attorney, Agent, or Firm* — Sony Corporation

(57) ABSTRACT

A display panel includes: a mounting substrate including light-emitting elements that are mounted for each pixel on a wiring substrate, in which the light-emitting elements have different luminescence wavelengths from each other; and a counter substrate provided in opposition to a surface, of the mounting substrate, on which the pixels are disposed, and including a light-shielding layer and a light diffusion layer. The light-shielding layer is provided on a surface, of a light transmissive substrate, that faces the pixels and has apertures at respective positions that face the light-emitting elements. The light diffusion layer blocks up the apertures, is provided on a surface, of the light-shielding layer, that faces the pixels, is at least in contact with end edges of the respective apertures, and forms a gap together with the light-emitting elements between the light diffusion layer and the light-emitting elements.

9 Claims, 11 Drawing Sheets

DISPLAY PANEL AND DISPLAY UNIT

CROSS REFERENCE TO RELATED APPLICATIONS

This application claims the benefit of Japanese Priority Patent Application JP 2013-007789 filed on Jan. 18, 2013, the entire contents of which are incorporated herein by reference.

BACKGROUND

The present disclosure relates to a display panel that is provided, for each pixel, with a plurality of light-emitting elements having different luminescence wavelengths from each other, and a display unit that includes such a display panel.

In recent years, as a lightweight and low-profile display, an LED (Light-Emitting Diode) display has drawn attention that uses LEDs for display pixels (see Japanese Unexamined Patent Application Publication No. 2009-272591).

SUMMARY

In a self-emitting display unit including an LED display, display colors may be viewed differently depending on a viewing direction of a display unit due to a difference in the light distribution characteristics among each of RGB light-emitting elements. Such a phenomenon may significantly deteriorate the display quality of a display unit.

It is desirable to provide a display panel capable of reducing deterioration in the display quality due to a difference in the light distribution characteristics, and a display unit that includes such a display panel.

According to an embodiment of the present disclosure, there is provided a display panel including: a mounting substrate including a plurality of light-emitting elements that are mounted for each pixel on a wiring substrate, the light-emitting elements having different luminescence wavelengths from each other; and a counter substrate provided in opposition to a surface, of the mounting substrate, on which the pixels are disposed, and including a light-shielding layer and a light diffusion layer, the light-shielding layer being provided on a surface, of a light transmissive substrate, that faces the pixels and having apertures at respective positions that face the light-emitting elements, and the light diffusion layer blocking up the apertures, being provided on a surface, of the light-shielding layer, that faces the pixels, being at least in contact with end edges of the respective apertures, and forming a gap together with the light-emitting elements between the light diffusion layer and the light-emitting elements.

According to an embodiment of the present disclosure, there is provided a display unit provided with a display panel and a driving circuit configured to drive the display panel, the display panel including: a mounting substrate including a plurality of light-emitting elements that are mounted for each pixel on a wiring substrate, the light-emitting elements having different luminescence wavelengths from each other; and a counter substrate provided in opposition to a surface, of the mounting substrate, on which the pixels are disposed, and including a light-shielding layer and a light diffusion layer, the light-shielding layer being provided on a surface, of a light transmissive substrate, that faces the pixels and having apertures at respective positions that face the light-emitting elements, and the light diffusion layer blocking up the apertures, being provided on a surface, of the light-shielding layer, that faces the pixels, being at least in contact with end edges of the respective apertures, and forming a gap together with the light-emitting elements between the light diffusion layer and the light-emitting elements.

In the display panel and the display unit according to the above-described respective embodiments of the present disclosure, the light diffusion layer is provided. The light diffusion layer blocks up each of the apertures of the light-shielding layer, is provided on a surface, of the light-shielding layer, that faces the pixels, and is at least in contact with the end edge of each of the apertures. This makes it possible to reduce variations in the contrast or tone of color depending on a viewing angle.

According to the display panel and the display unit of the above-described respective embodiments of the present disclosure, it is possible to reduce variations in the contrast or tone of color depending on a viewing angle, which allows to reduce deterioration in the display quality due to a difference in the light distribution characteristics.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to explain the principles of the present technology.

DETAILED DESCRIPTION

Hereinafter, some embodiments of the present disclosure are described in details with reference to the drawings. It is to be noted that the descriptions are provided in the order given below.

1. Embodiment (FIG. 1 to FIG. 5B)
2. Modification Examples (FIG. 6 to FIG. 17)

1. Embodiment

Configuration

Figure 1:
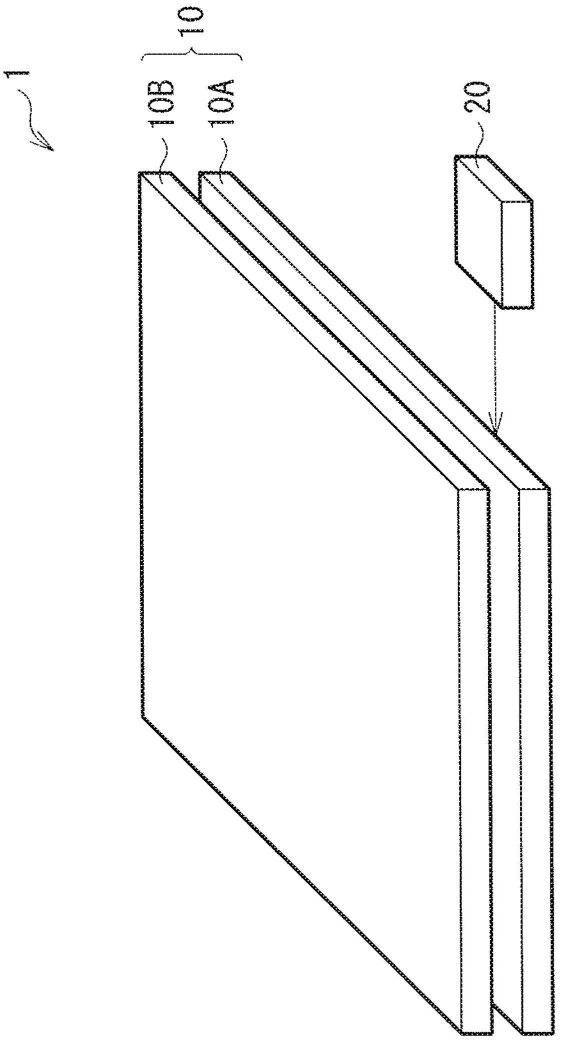
FIG. 1 is a perspective view showing an example of a display unit according to an embodiment of the present disclosure.

FIG. 1 is a perspective view showing an example of a simplified configuration for a display unit 1 according to an embodiment of the present disclosure. The display unit 1 according to the present embodiment is a so-called LED display, and uses LEDs for display pixels. As shown in an example in FIG. 1, the display unit 1 may include a display panel 10 and a driving circuit 20 that drives the display panel 10 (more specifically, light-emitting elements 45 to be hereinafter described).

(Display Panel 10)

The display panel 10 is configured of a mounting substrate 10A and a counter substrate 10B that are overlaid with one another. On the mounting substrate 10A, the plurality of light-emitting elements 45 having different luminescence wavelengths from each other are mounted for each pixel. The counter substrate 10B is disposed to oppose a surface, of the mounting substrate 10A, on which the pixels are provided. The counter substrate 10B, a surface of which is served as an image display face, has a display region at a central part thereof and a frame region that is a non-display region around the display region.

(Mounting Substrate 10A)

Figure 2:
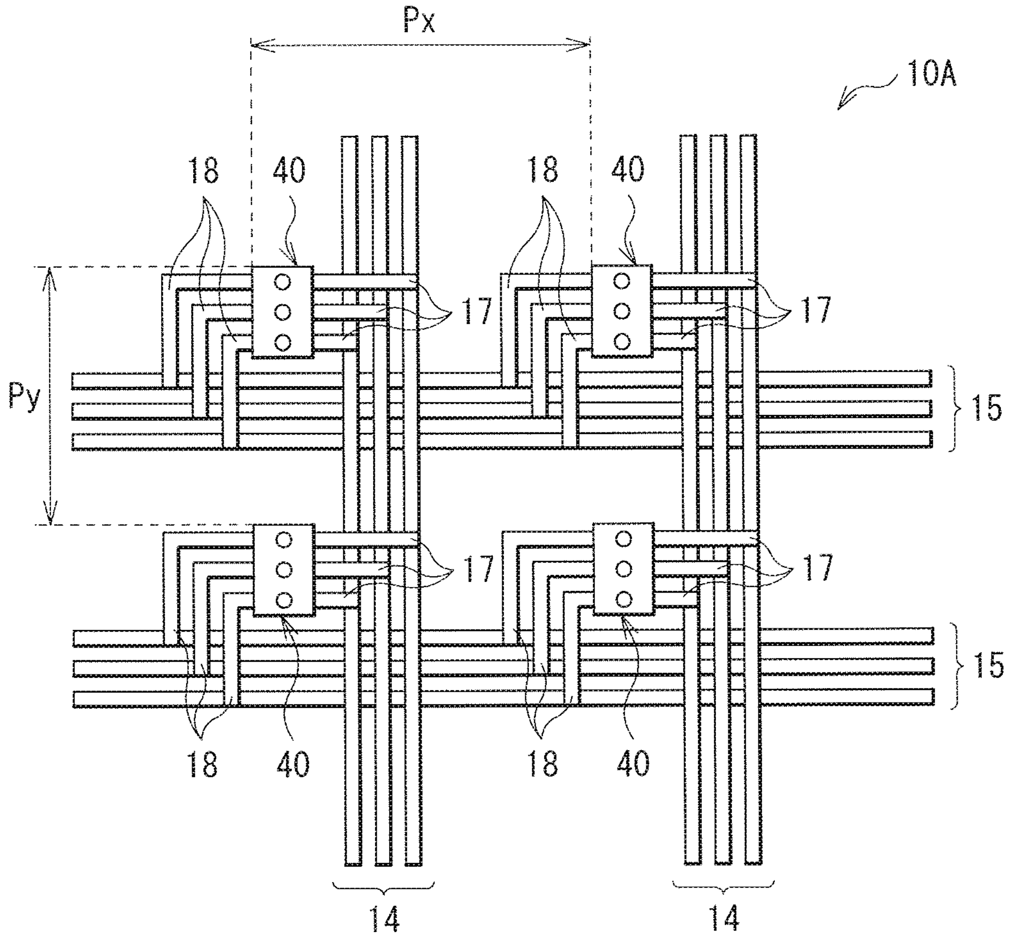
FIG. 2 is a plan view showing an example of a layout on a surface of a mounting substrate illustrated in FIG. 1.

FIG. 2 shows an example of a layout for a region corresponding to the display region of the surface on the counter substrate 10B side of the mounting substrate 10A. As shown in an example in FIG. 2, the mounting substrate 10A may have a plurality of Y-wires 14 and a plurality of X-wires 15 at a region corresponding to the display region of the surface of the mounting substrate 10A. The X-wires 15 are equivalent to scan wires. The Y-wires 14 and the X-wires 15 may be formed, for example, within the mounting substrate 10A, and may not be formed on a mounting surface on which light-emitting devices 40 (to be hereinafter described) that are equivalent to display pixels are mounted. In other words, the mounting surface is almost flat, and a region with which a later-described wall section 10C comes in contact of the mounting substrate is also almost flat.

The Y-wire 14 is a data wiring to which a signal in response to an image signal is input by the driving circuit 20. The plurality of Y-wires 14 are formed to extend in a predetermined direction (a column direction in the drawing), and are disposed in parallel with each other at predetermined pitches. The X-wire 15 is a scan wiring to which a signal for selecting the light-emitting device 40 is input by the driving circuit 20. The plurality of X-wires 15 are formed to extend in a direction intersecting with (for example, orthogonal to) the Y-wires 14 (a row direction in the drawing), and are disposed in parallel with each other at predetermined pitches. Each of the Y-wire 14 and the X-wire 15 may be made of, for example, a conductive material such as Cu (copper). The X-wires 15 are disposed within a deeper layer than a layer where the Y-wires 14 are disposed, more specifically, within a layer between a later-described support substrate 11 and a layer including the Y-wires 14 (in concrete terms, within a same layer as a later-described interlayer insulating film 12).

The mounting substrate 10A has the plurality of light-emitting devices 40 that are equivalent to display pixels. The plurality of light-emitting devices 40 may be, for example, disposed side by side in a direction parallel to the Y-wires 14 and in a direction parallel to the X-wires 15. In other words, the plurality of light-emitting devices 40 are disposed in a matrix pattern within the display region. The plurality of light-emitting devices 40 are disposed at pitches Px in a row direction and at pitches Py in a column direction. Therefore, a single pixel has the area of Px×Py. Here, each of the Px and Py may have a size of about several hundred micrometers, for example. Each of the light-emitting devices 40 is electrically connected with the Y-wires 14 via conductive connecting sections 17 and is electrically connected with the X-wires 15 via conductive connecting sections 18.

Figure 3:
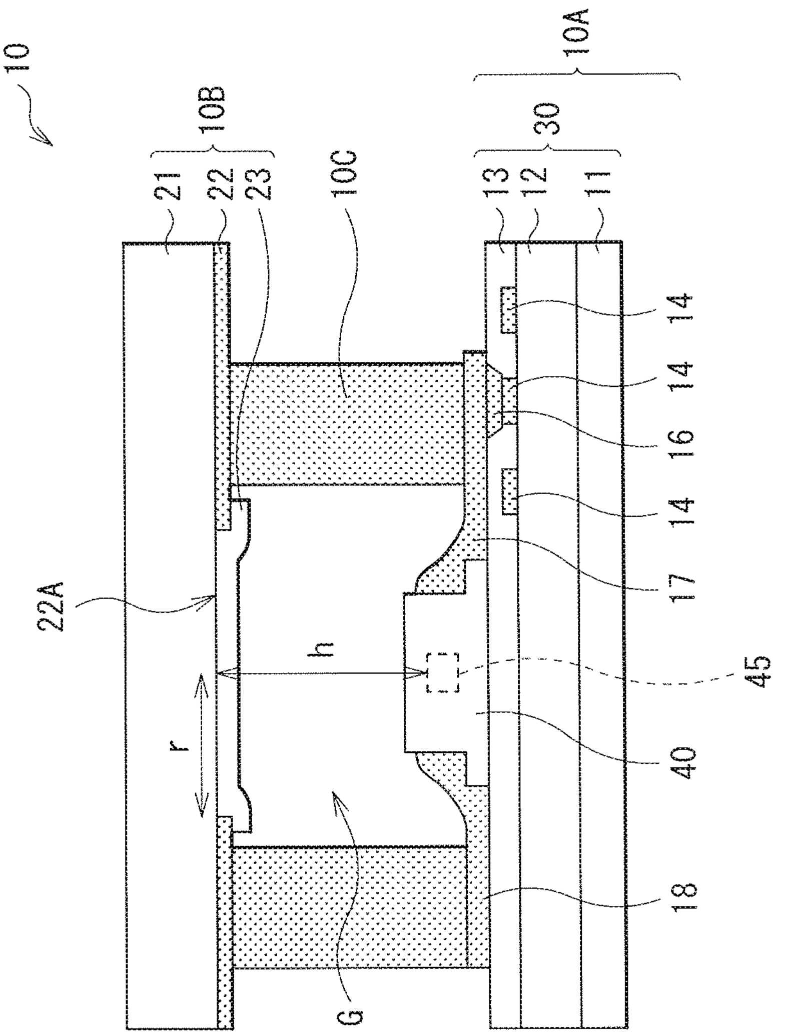
FIG. 3 is a cross-sectional view showing a configuration example of a cross section traversing a light-emitting device in the display unit illustrated in FIG. 1.

FIG. 3 shows an example of a cross-sectional configuration for the display panel 10. In the mounting substrate 10A, for example, the plurality of light-emitting devices 40 may be mounted on a wiring substrate 30. The wiring substrate 30 may be configured of, for example, an interlayer insulating film 12 and an interlayer insulating film 13 that are laminated in this order on the support substrate 11. The support substrate 11 may be made of, for example, a glass substrate, a resin substrate, or the like. Each of the interlayer insulating film 12 and the interlayer insulating film 13 may be made of, for example, a material such as SiN, $SiO_2$, or $Al_2O$. Here, the interlayer insulating film 13 is a layer configuring the topmost surface of the support substrate 11, and for example, the Y-wires 14 may be formed within the same layer as the interlayer insulating film 13 that is the topmost layer. In such example, the Y-wires 14 are electrically connected with the connecting sections 17 via conductive connecting sections 16 that are formed within the same layer as the interlayer insulating film 13. On the other hand, the X-wires 15 may be formed, for example, within a layer between the support substrate 11 and the interlayer insulating film 13, and may be formed, for example, within the same layer as the interlayer insulating film 12. In such example, the X-wires 15 are electrically connected with the connecting sections 18 via conductive connecting sections that are formed within the same layer as the interlayer insulating films 12 and 13.

(Counter Substrate 10B)

The counter substrate 10B may have, for example, a transparent substrate 21 (light transmissive substrate), as well as a black matrix 22 (light-shielding layer) and a light diffusion layer 23 that are formed on the mounting substrate 10A side of the transparent substrate 21. The black matrix 22 and the light diffusion layer 23 are laminated in this order on the surface on the mounting substrate 10A side of the transparent substrate 21. The transparent substrate 21 may be, for example, a light transmissive substrate, such as a glass substrate and a transparent resin substrate. The black matrix 22 is formed in contact with the surface on the mounting substrate 10A side of the transparent substrate 21, and has apertures 22A at respective positions facing the light-emitting devices 40. In other words, an aperture pattern of the black matrix 22 is a pattern corresponding to a display pixel array, and is not a specific display pattern (for example, seven-segment pattern in use for numerical display).

Figure 4:
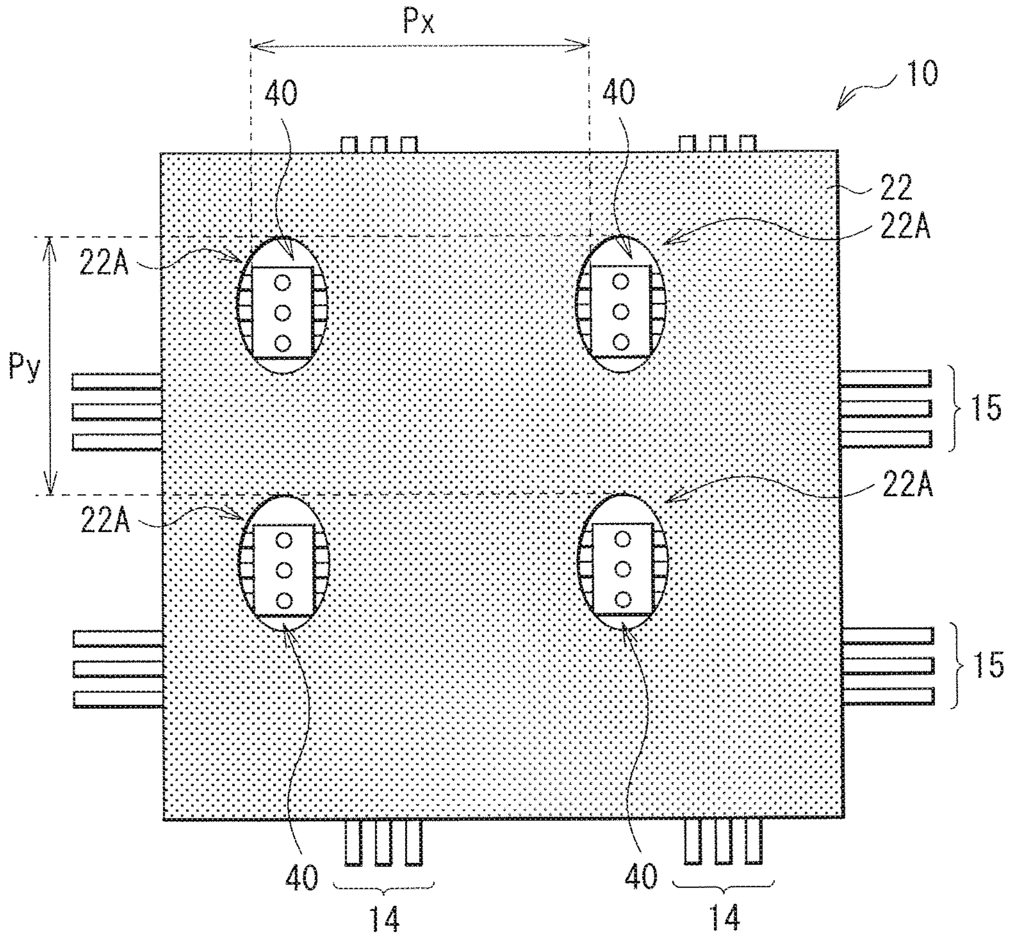
FIG. 4 is a plan view showing an example of a planar configuration for a black matrix illustrated in FIG. 3.

As shown in an example in FIG. 4, the plurality of apertures 22A are disposed side by side in a direction parallel to the Y-wires 14 and in a direction parallel to the X-wires 15. In other words, the plurality of apertures 22A are disposed in a matrix pattern within the display region. The plurality of apertures 22A are disposed at the pitches Px in a row direction and at the pitches Py in a column direction. Therefore, an aperture ratio of a single pixel is represented by an expression of [the area of the aperture 22A/(Px×Py)]×100(%). The area (or an aperture diameter r) of the aperture 22A is defined on the basis of a distance "h" between the light-emitting element 45 (to be hereinafter described) within the light-emitting device 40 and the transparent substrate 21, and on the basis of a refractive index "n" of a medium between the light-emitting element 45 within the light-emitting device 40 and the transparent substrate 21. The aperture ratio of a single pixel may be, for example, about 10% or less. The aperture diameter "r" of the aperture 22A may be preferably a value to be obtained by an expression of $h \times \tan(\arcsin(1/n))$. The distance "h" may be, for example, about several dozen of micrometers. It is to be noted that a reference point (center point) of the aperture diameter "r" is located directly above each of the light-emitting elements 45 within the light-emitting device 40.

When the plurality of light-emitting elements 45 within the light-emitting device 40 are laid out in a line within the light-emitting device 40, each of the apertures 22A may take an elliptical form or a shape similar to the elliptical form that extends in an array direction of the plurality of light-emitting elements 45 included within the single light-emitting device 40 (or a single display pixel) as shown in an example in FIG. 4. This makes it possible to reduce vignetting, which is a phenomenon of light from the light-emitting device 40 being shielded by the black matrix 22, as well as to minimize the aperture ratio of a single pixel. In an example where the aperture diameter "r" is defined, for example, as a value to be obtained by the expression of $h \times \tan(\arcsin(1/n))$, each of the apertures 22A may preferably take an elliptical form that comes in contact with the outer edge of a circle having the aperture diameter "r" that is defined for each of the light-emitting elements 45.

The light diffusion layer 23 reduces variations in the contrast or tone of color depending on a viewing angle due to a difference in the light distribution characteristics among each of the light-emitting elements 45 within the light-emitting device 40. The light diffusion layer 23 blocks up each of the apertures 22A, and is formed on a surface on the light-emitting elements 45 side of the black matrix 22 at least in contact with an end edge of each of the apertures 22A. The light diffusion layer 23 may be formed in a method of, for example, coating (or printing) a painting material containing a light diffusion agent, and may come in contact with a surface exposed within each of the apertures 22A of the transparent substrate 21. The light diffusion layer 23 is provided at a position that does not come in contact with the top surface of the light-emitting device 40, and a gap G is present between the light diffusion layer 23 and the top surface of the light-emitting device 40. As a result, this makes it possible to reduce the material costs and manufacturing costs.

Figure 5A:
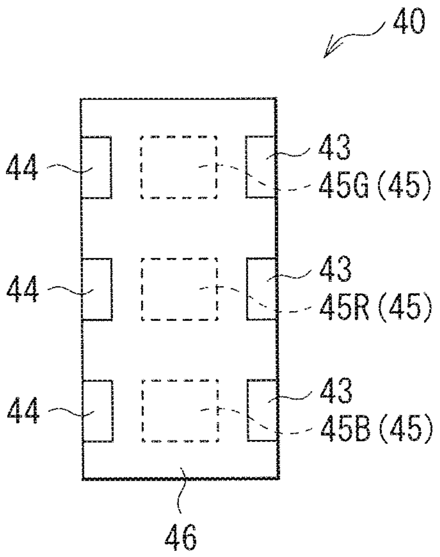
FIG. 5A is a top view showing an example of a top surface configuration for a light-emitting device illustrated in FIG. 2.
Figure 5B:
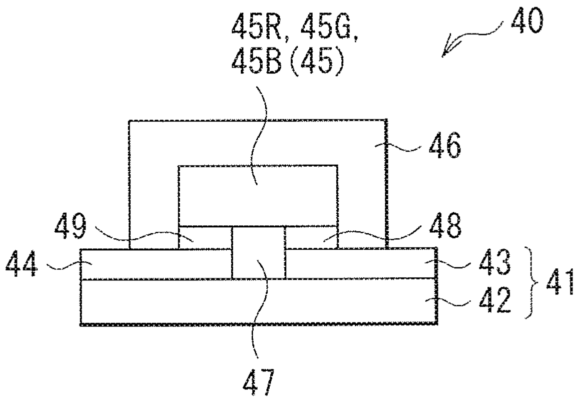
FIG. 5B is a cross-sectional view showing an example of a cross-sectional configuration for the light-emitting device illustrated in FIG. 2.

Next, the description is provided on an internal configuration of the light-emitting device 40. FIG. 5A shows an example of a top surface configuration for the light-emitting device 40. FIG. 5B shows an example of a cross-sectional configuration that traverses the light-emitting element 45 in the light-emitting device 40 illustrated in FIG. 5A.

The light-emitting device 40 mounts the plurality of light-emitting elements 45 (light-emitting elements) on a device substrate 41. Each of the light-emitting elements 45 is configured to emit luminous light on the top surface side (counter substrate 10B side) of the light-emitting device 40. Accordingly, light outgoing from each of the light-emitting elements 45 is emitted to the outside via the top surface of the light-emitting device 40, the gap G, the light diffusion layer 23, and the transparent substrate 21. The plurality of light-emitting elements 45 may be laid out in a line within the light-emitting device 40, for example. The light-emitting element 45 may be, for example, an LED chip. The light-emitting element 45 may have, for example, a semiconductor layer including a laminated structure that interposes an active layer between semiconductor layers having different conductivity types from one another, as well as two electrodes 48 and 49 that are disposed on a common surface (on the same surface) of the semiconductor layers. The electrode 48 is electrically connected with one conductivity-type semiconductor layer within the semiconductor layer on the light-emitting element 45, while the electrode 49 is electrically connected with the other conductivity-type semiconductor layer within the semiconductor layer on the light-emitting element 45.

The device substrate 41 may have a configuration in which, for example, an insulating layer, electrode pads 43 and 44 are laminated in this order on a support substrate 42. The support substrate 42 may be configured of, for example, a silicon substrate, a resin substrate, or the like. The insulating layer forms a flat surface as a surface for forming electrode pads 45A and 45B, and may be made of, for example, SiN, $SiO_2$, or $Al_2O_3$. The electrode pads 43 and 44 may function as a feeding layer in the electrolytic plating, and may further function as electrode pads on which the light-emitting elements 45 are mounted, for example. Each of the electrode pads 43 and 44 may be made of, for example, a material such as aluminum, copper, and nickel.

The light-emitting element 45 is mounted on the electrode pads 43 and 44. More specifically, the first electrode 48 of the light-emitting element 45 is connected with the electrode pad 43 via a plated metal (not shown in the drawing), while the second electrode 49 of the light-emitting element 45 is connected with the electrode pad 44 via a plated metal (not shown in the drawing). In other words, the electrode 48 is disposed at a position facing at least a part of the electrode pad 43, and is joined by plating with the electrode pad 43. On the other hand, the electrode 49 is disposed at a position facing at least a part of the electrode pad 44, and is joined by plating with the electrode pad 44.

The luminescence wavelengths of the plurality of light-emitting elements 45 included within the light-emitting device 40 are different from each other. When the light-emitting device 40 has three light-emitting elements 45, the luminescence wavelengths of these three light-emitting elements 45 are different from each other. One of these light-emitting elements 45 may be, for example, a light-emitting element 45R to emit red light, a second one may be, for example, a light-emitting element 45G to emit green light, and third one may be, for example, a light-emitting element 45B to emit blue light.

The device substrate 41 may further have, for example, a resin member 47 within a layer between each of the light-emitting elements 45 and the support substrate 42. The resin member 47 fixes the light-emitting elements 45 and the support substrate 42 with each other, and may be made of, for example, a cured ultraviolet curing resin. In performing the electrolytic plating, the resin member 47 is intended to support the light-emitting elements 45 above the support substrate 42 (that is, in midair), and to provide a void between the electrodes 48 and 49 as well as between the electrode pads 43 and 44.

The display panel 10 is provided with a wall section 10C between the mounting substrate 10A and the counter substrate 10B. In bonding the mounting substrate 10A and the counter substrate 10B with one another in a manufacturing process, the wall section 10 C is provided on either the mounting substrate 10A or the counter substrate 10B. The wall section 10C may be provided, for example, one by one for each display pixel, and may take a circular (for example, doughnut-like) form surrounding the light-emitting device 40 as shown in an example in FIG. 3. The wall section 10C may be configured of, for example, a material that allows a pattern to be formed using a photolithographic method. Examples of such a material may include a photosensitive resist material or a photosensitive resin, such as VPA (available from Nippon Steel Chemical Co., Ltd.). It is to be noted that the wall section 10C in each display pixel may be joined with each other in a reticular pattern.

[Manufacturing Method]

Next, the description is provided on an example of a method of manufacturing the light-emitting device 40. First, the support substrate 42 is covered with an insulating film to form a flat surface, and then the electrode pads 43 and 44 are formed on the flat surface. Subsequently, a photosensitive resin is coated over the whole surface, and then the light-emitting element 45 is mounted on the electrode pads 43 and 44. Thereafter, an ultraviolet ray is applied from the support substrate 42 side while blocking out the light with the electrode pads 43 and 44. As a result, the photosensitive resin is cured to form the resin member 47 at a region between the electrode pads 43 and 44. Afterward, the light-emitting element 45 is covered with a protective material 46. In such a manner, the light-emitting device 40 is manufactured.

Subsequently, the description is provided on an example of a method of manufacturing the display panel 10. First, the wiring substrate 30 having a flat mounting surface is prepared. Next, the plurality of light-emitting devices 40 are mounted in a matrix pattern on the wiring substrate 30, and then the connecting sections 17 and 18 are formed. In such a manner, the mounting substrate 10A is manufactured. Further, the transparent substrate 21 is prepared, and after the black matrix 22 having the plurality of apertures 22A in a matrix pattern is printed on a surface of the transparent substrate 21, the light diffusion layer 23 is printed to cover each of the apertures 22A and the end edge of each aperture 22A on the black matrix 22. In such a manner, the counter substrate 10B is manufactured. Thereafter, the plurality of wall sections 10C are formed on the mounting surface of the mounting substrate 10A, and then the mounting substrate 10A and the counter substrate 10B are bonded with one another with the wall sections 10C interposed between. In such a manner, the display panel 10 is manufactured.

[Function and Effects]

Next, the description is provided on the function and effects of the display panel 10 according to the present embodiment. In the present embodiment, the black matrix 22 and the light diffusion layer 23 are laminated in this order on the surface of the mounting substrate 10A side of the transparent substrate 21. As a result, the light diffusion layer 23 is not exposed at any location other than the apertures 22A when viewed from the image display face side, which makes it possible to prevent deterioration in the contrast due to diffused reflection of outside light by the light diffusion layer 23. Further, since the light diffusion layer 23 is provided to cover the apertures 22A, it is possible to reduce variations in the contrast or tone of color depending on a viewing angle due to a difference in the light distribution characteristics among each of the light-emitting elements 45 within the light-emitting device 40. Therefore, this allows to reduce deterioration in the display quality due to a difference in the light distribution characteristics.

Further, in the present embodiment, the aperture 22A may take an elliptical form or a shape similar to the elliptical form, which makes it possible to reduce vignetting, as well as to decrease the aperture ratio of a single pixel. This allows the contrast to be enhanced. Additionally, in the present embodiment, the aperture diameter r of the aperture 22A may be defined as a value to be obtained by the expression of $h \times \tan(\arcsin(1/n))$, which makes it possible to reduce the vignetting and minimize the aperture ratio of a single pixel. As a result, this allows the contrast to be further improved.

2. Modification Examples

Modification Example 1

Figure 6:
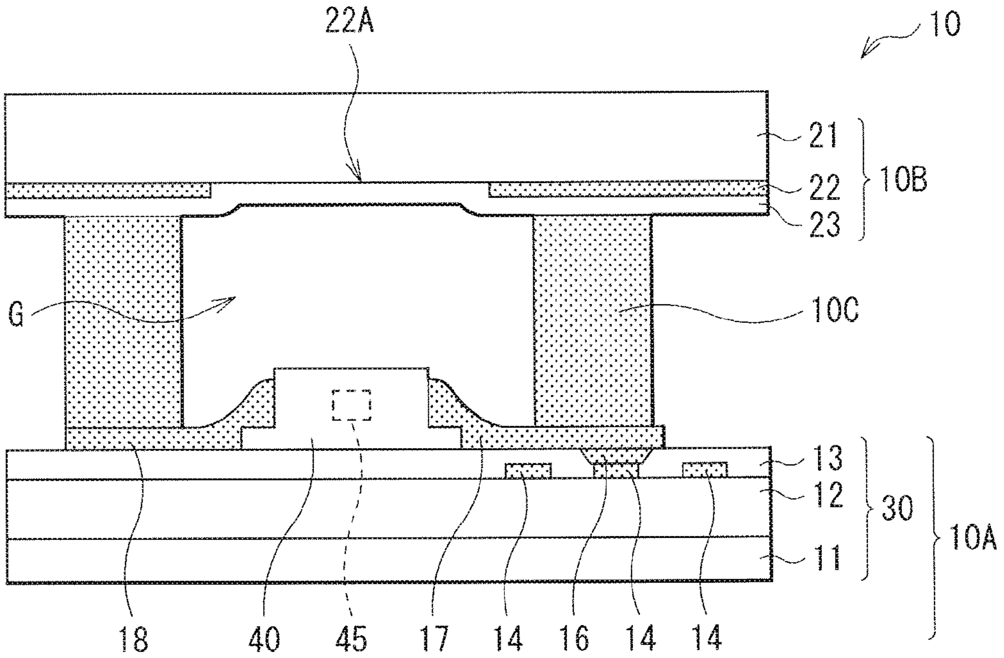
FIG. 6 is a cross-sectional view showing a first modification example of a configuration for a cross section traversing the light-emitting device in the display unit illustrated in FIG. 1.
Figure 7:
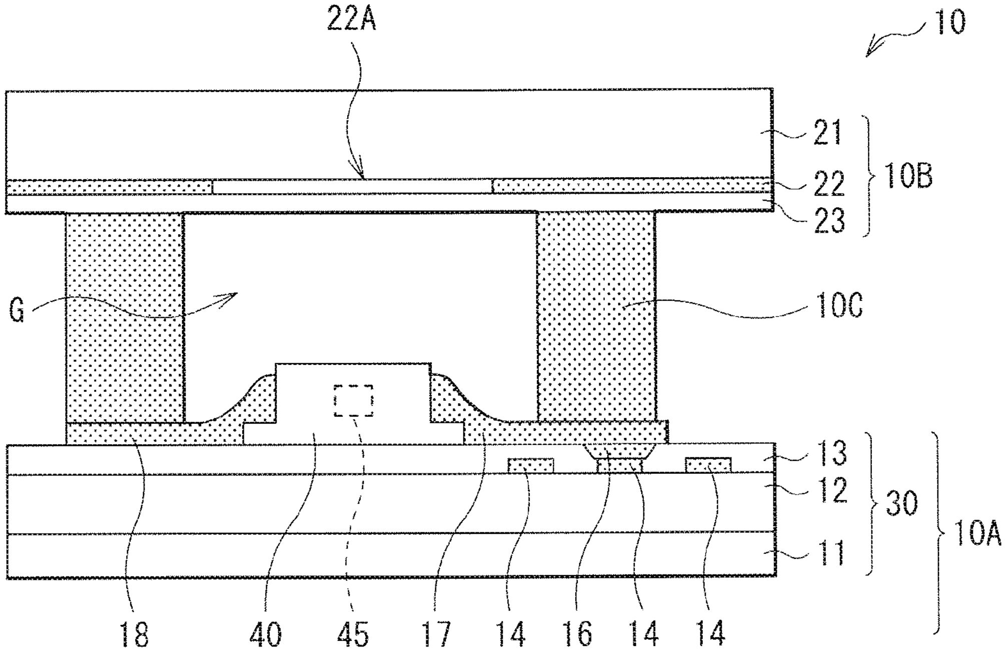
FIG. 7 is a cross-sectional view showing a second modification example of a configuration for a cross section traversing the light-emitting device in the display unit illustrated in FIG. 1.

In the above-described embodiment of the present disclosure, a case where the light diffusion layer 23 is formed only on a part of the surface of the transparent substrate 21 is exemplified, although the light diffusion layer 23 may be formed over the whole area of the surface of the transparent substrate 21 as shown in an example in FIG. 6. Even in such a case, the same effects as with the above-described embodiment of the present disclosure are achieved. In this example, the light diffusion layer 23 covers not only the apertures 22A but also the black matrix 22. Further, the top end of the wall section 10C comes in contact with the light diffusion layer 23.

Modification Example 2

In the above-described embodiment of the present disclosure, a case where the light diffusion layer 23 is formed in a method of coating (or printing) a painting material containing a light diffusion agent is exemplified, although the light diffusion layer 23 may be configured of a light diffusion film. In such a case, as shown in an example in FIG. 7, the light diffusion layer 23 does not come in contact with a surface exposed within the aperture 22A of the transparent substrate 21. Accordingly, a void is formed between the light diffusion layer 23 and a surface exposed within the aperture 22A of the transparent substrate 21. When the void is present within the aperture 22A, the total reflection on the surface exposed within the aperture 22A of the transparent substrate 21 is suppressed, leading to the optical waveguiding within the transparent substrate 21 being suppressed. As a result, this allows the luminance to be enhanced.

In this modification example, a material with the refractive index lower than that of the transparent substrate 21 may be filled into the apertures 22A. Even in such a case, the same effects as with the above-described embodiment of the present disclosure are achieved.

Modification Example 3

Figure 8:
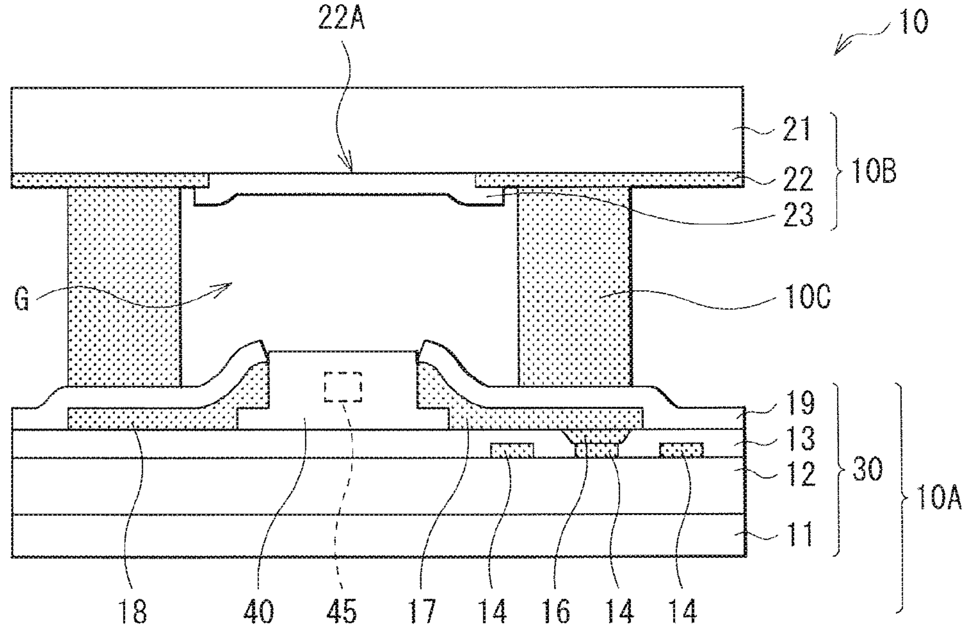
FIG. 8 is a cross-sectional view showing a third modification example of a configuration for a cross section traversing the light-emitting device in the display unit illustrated in FIG. 1.
Figure 9:
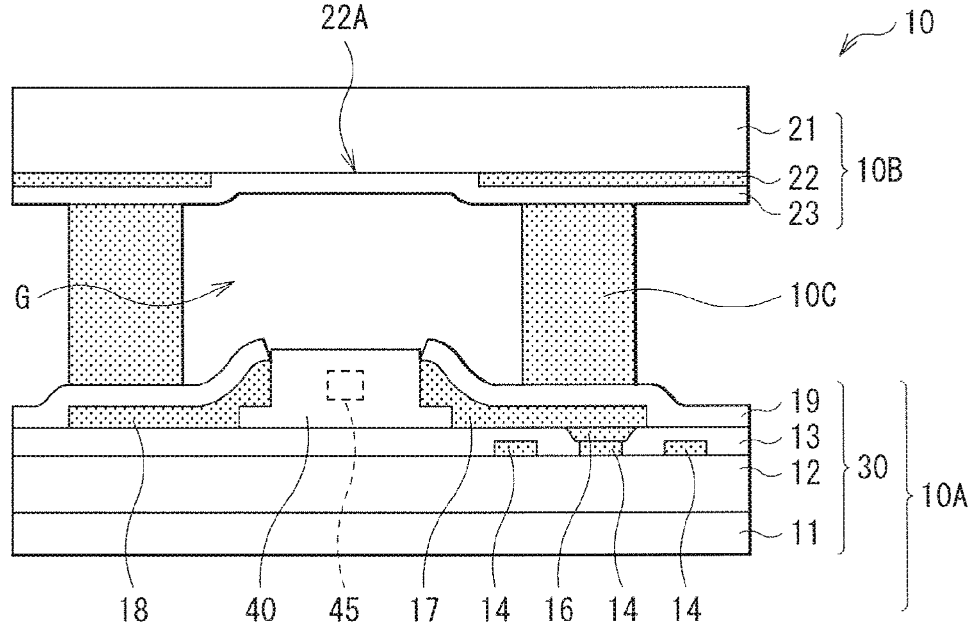
FIG. 9 is a cross-sectional view showing a fourth modification example of a configuration for a cross section traversing the light-emitting device in the display unit illustrated in FIG. 1.
Figure 10:
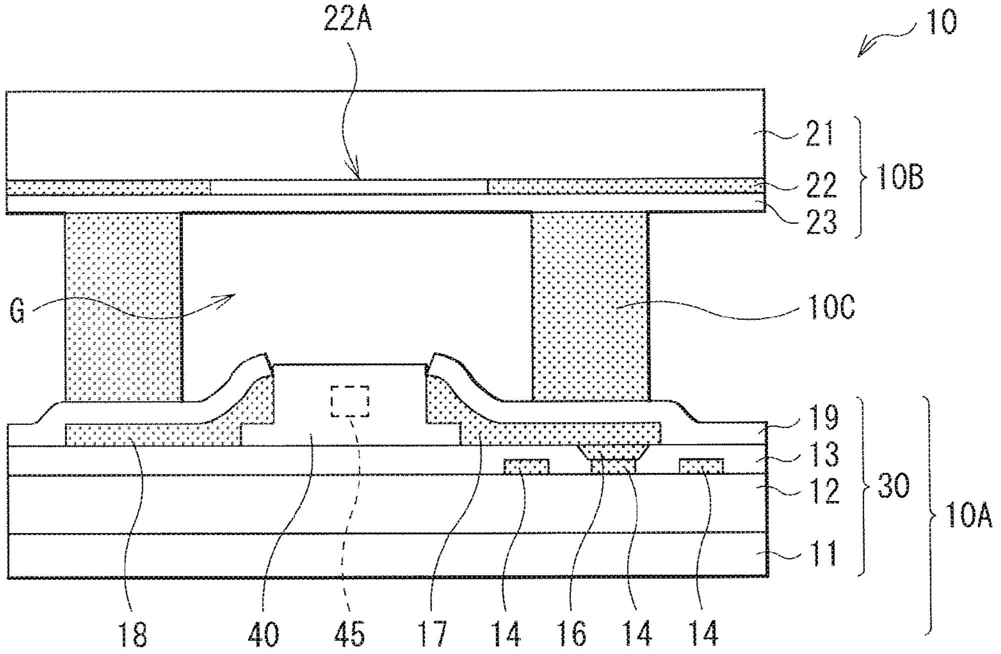
FIG. 10 is a cross-sectional view showing a fifth modification example of a configuration for a cross section traversing the light-emitting device in the display unit illustrated in FIG. 1.

For example, as shown in FIG. 8, FIG. 9, and FIG. 10, in the above-described embodiment as well as the above-described modification examples 1 and 2, the mounting substrate 10A may have a light reflective layer 19 that covers a surface around the light-emitting device 40 (or the plurality of light-emitting elements 45). The light reflective layer 19 may be provided on a surface excluding the top surface of the light-emitting device 40, for example. In this example, the bottom end of the wall section 10C comes in contact with the light reflective layer 19. The light reflective layer 19 has a mirrored surface or a diffused reflective surface having high reflectivity for visible light. The light reflective layer 19 may be formed in a method of, for example, printing a material a surface of which serves as a mirrored surface or a diffused reflective surface on the surface excluding the top surface of the light-emitting device 40 of the mounting substrate 10A. In this modification example, light outgoing from the light-emitting device 40 is reflected by the light reflective layer 19, and the reflected light is emitted to the outside via the apertures 22A. As a result, this allows the luminance to be enhanced.

Modification Example 4

Figure 11:
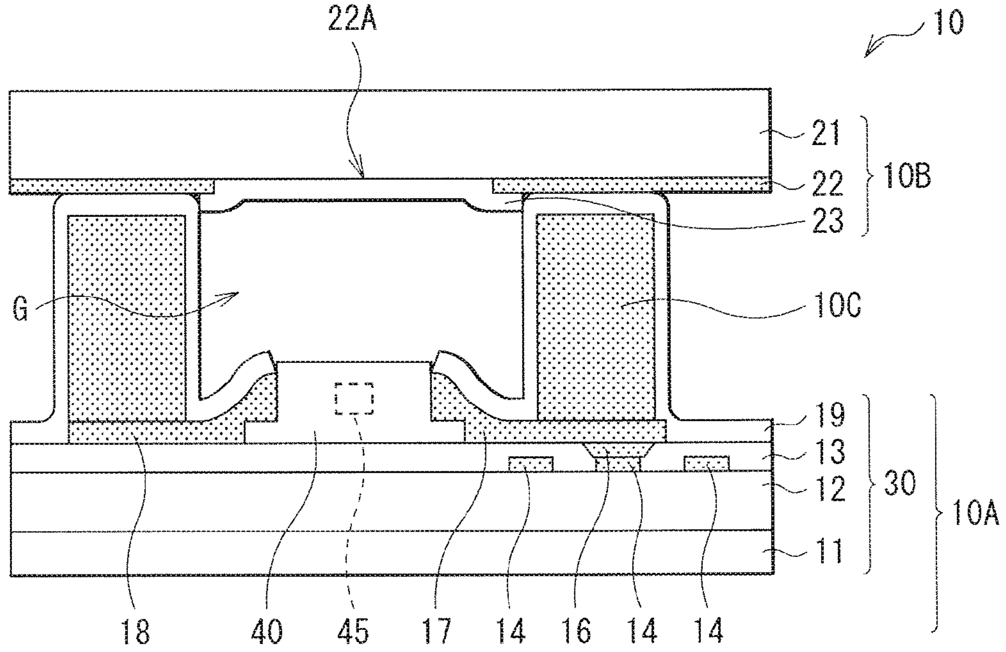
FIG. 11 is a cross-sectional view showing a sixth modification example of a configuration for a cross section traversing the light-emitting device in the display unit illustrated in FIG. 1.
Figure 12:
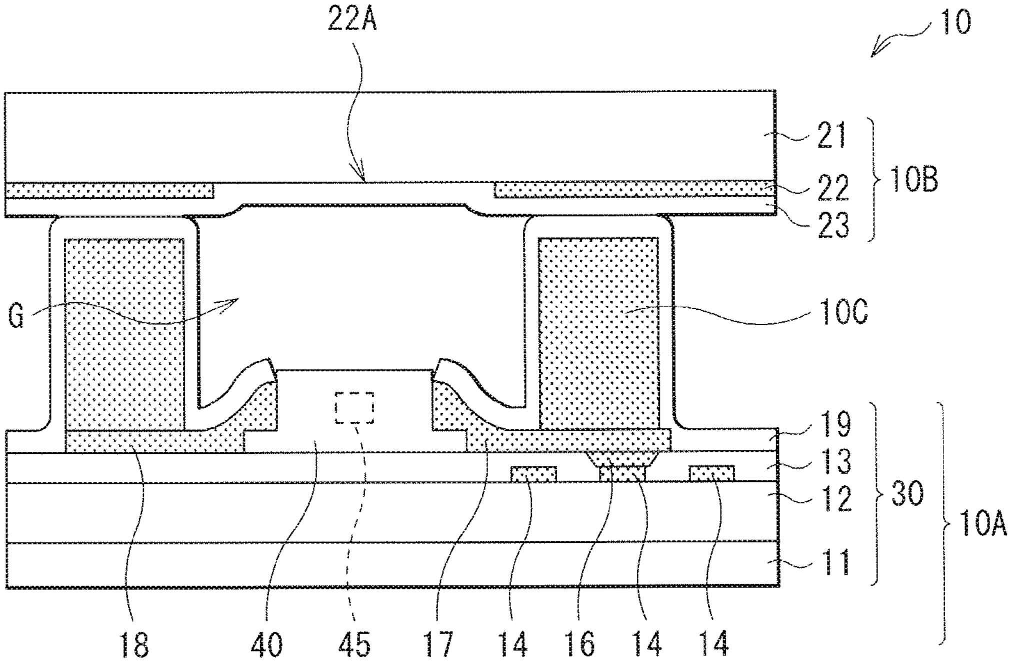
FIG. 12 is a cross-sectional view showing a seventh modification example of a configuration for a cross section traversing the light-emitting device in the display unit illustrated in FIG. 1.
Figure 13:
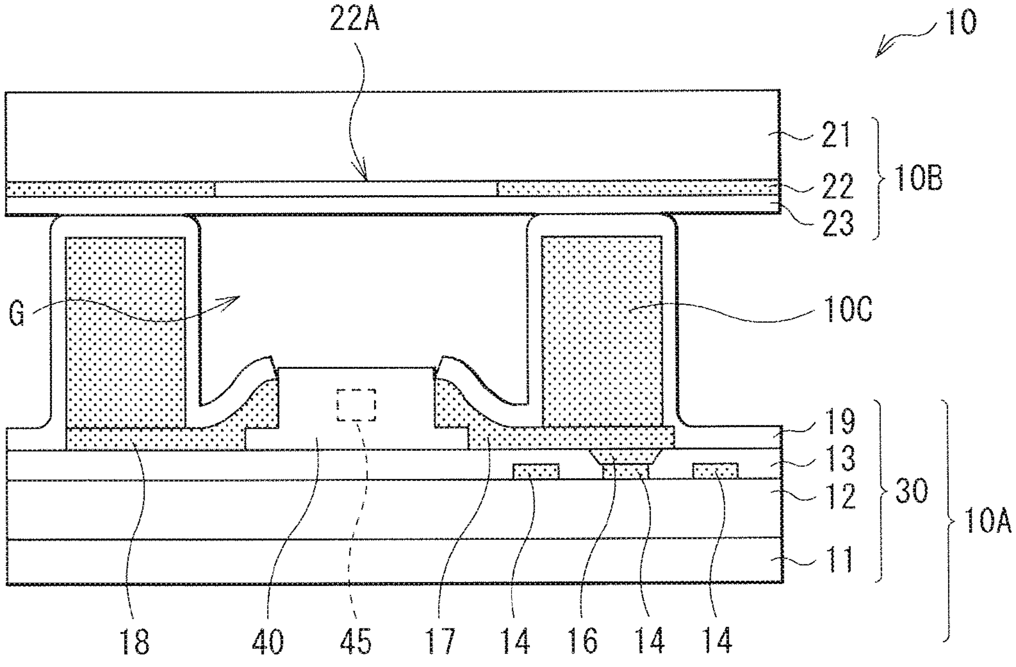
FIG. 13 is a cross-sectional view showing an eighth modification example of a configuration for a cross section traversing the light-emitting device in the display unit illustrated in FIG. 1.
Figure 14:
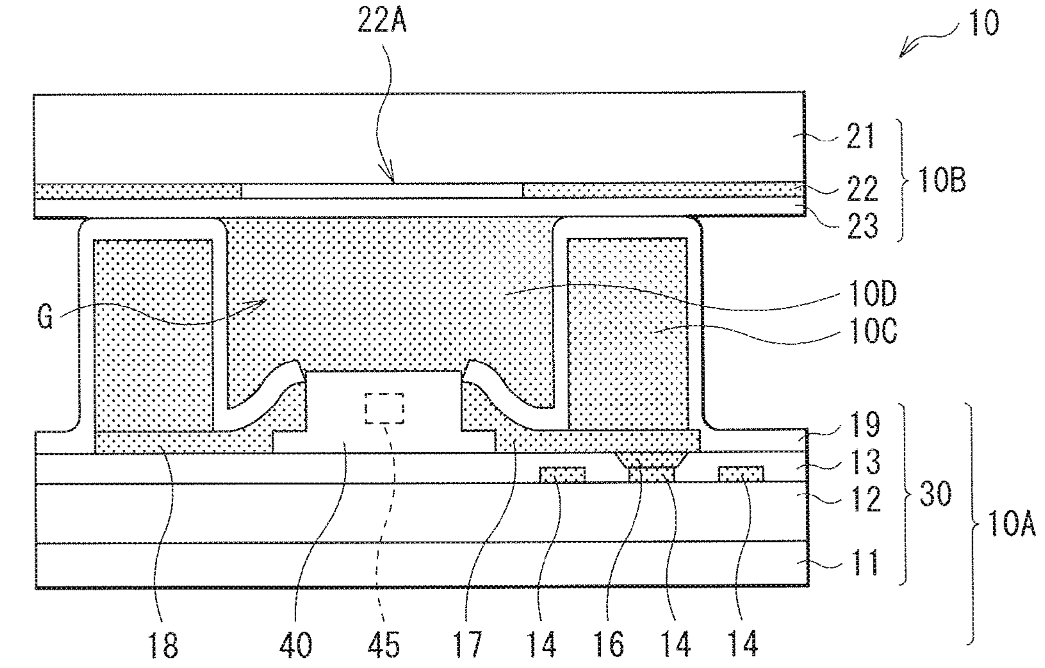
FIG. 14 is a cross-sectional view showing a ninth modification example of a configuration for a cross section traversing the light-emitting device in the display unit illustrated in FIG. 1.

For example, as shown in FIG. 11, FIG. 12, and FIG. 13, in the above-described embodiment as well as the above-described modification examples 1 and 2, the light reflective layer 19 may further cover at least the inner side surface of the wall section 10C as well. The light reflective layer 19 may be provided, for example, on the surface excluding the top surface of the light-emitting device 40 and a portion that comes in contact with the wall section 10C of the mounting substrate 10A, and on the side surface of at least the light-emitting device 40 side of the wall section 10C. The light reflective layer 19 may cover the side surface and the top surface of the wall section 10C. The light reflective layer 19 has a mirrored surface or a diffused reflective surface having high reflectivity for visible light. The light reflective layer 19 may be formed in a method of, for example, printing a material a surface of which serves as a mirrored surface or a diffused reflective surface on the surface excluding the top surface of the light-emitting device 40 of the mounting substrate 10A after the wall sections 10C are provided of the mounting substrate 10A. In this modification example, light outgoing from the light-emitting device 40 is reflected by the light reflective layer 19, and the reflected light is emitted to the outside via the apertures 22A. As a result, this allows the luminance to be enhanced.

Modification Example 5

In the above-described embodiment as well as the above-described modification examples 1 to 4, a void (the void formed by the wall section 10C) on the light-emitting device 40 may be filled with a material having the refractive index equivalent to or almost equivalent to that of the light diffusion layer 23. The display panel 10 may be provided with a member having the refractive index equivalent to that of the light diffusion layer 23 for filling internal spaces of the wall sections 10C. As shown in an example in FIG. 14, a void (the void formed by the wall section 10C) on the light-emitting device 40 may be filled with a resin layer 10D that is made of a material having the refractive index equivalent to or almost equivalent to that of the light diffusion layer 23. The resin layer 10D may be formed in a method of, for example, printing a material having the refractive index equivalent to or almost equivalent to that of the light diffusion layer 23 at internal spaces of the wall sections 10C after the wall sections 10C are provided on the mounting substrate 10A. It is to be noted that a void extending to the outside of the wall section 10C may be also filled with a material having the refractive index equivalent to or almost equivalent to that of the light diffusion layer 23. In this modification example, it is possible to reduce a rate of reflection of the light that is emitted from the light-emitting device 40 and comes into the light diffusion layer 23 on the surface of the light diffusion layer 23. As a result, this allows the luminance to be enhanced.

Modification Example 6

Figure 15:
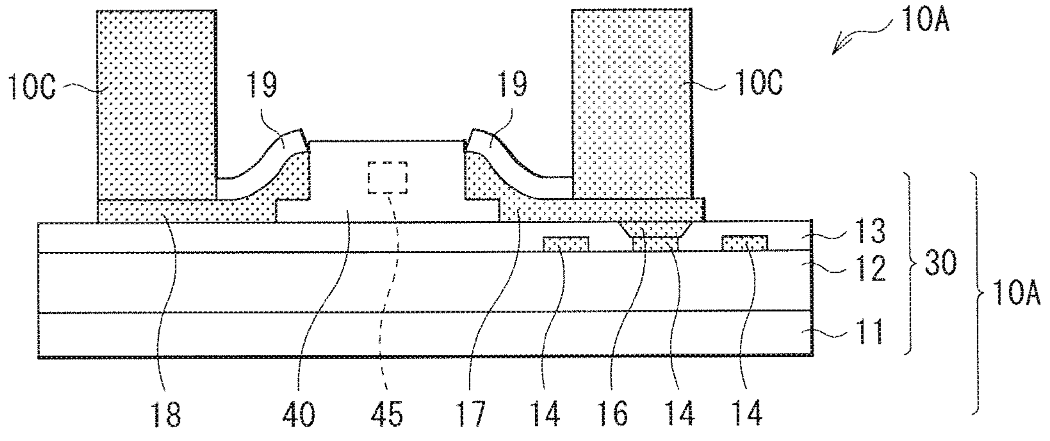
FIG. 15 is a cross-sectional view showing a modification example of a light reflective layer illustrated in any one of FIG. 8 to FIG. 10.
Figure 16:
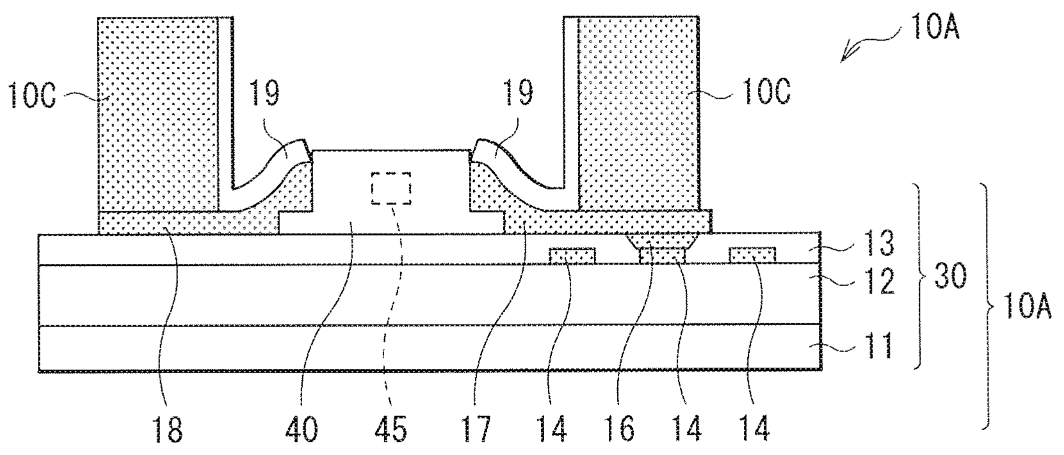
FIG. 16 is a cross-sectional view showing a modification example of the light reflective layer illustrated in any one of FIG. 11 to FIG. 14.

In the above-described modification examples 4 and 5, the light reflective layer 19 may be formed only at an internal space of the wall section 10C as shown in an example in FIG. 15. Further, in the above-described embodiment as well as the above-described modification examples 4 and 5, the light reflective layer 19 may be formed only at an internal space of the wall section 10C as shown in an example in FIG. 16.

Modification Example 7

Figure 17:
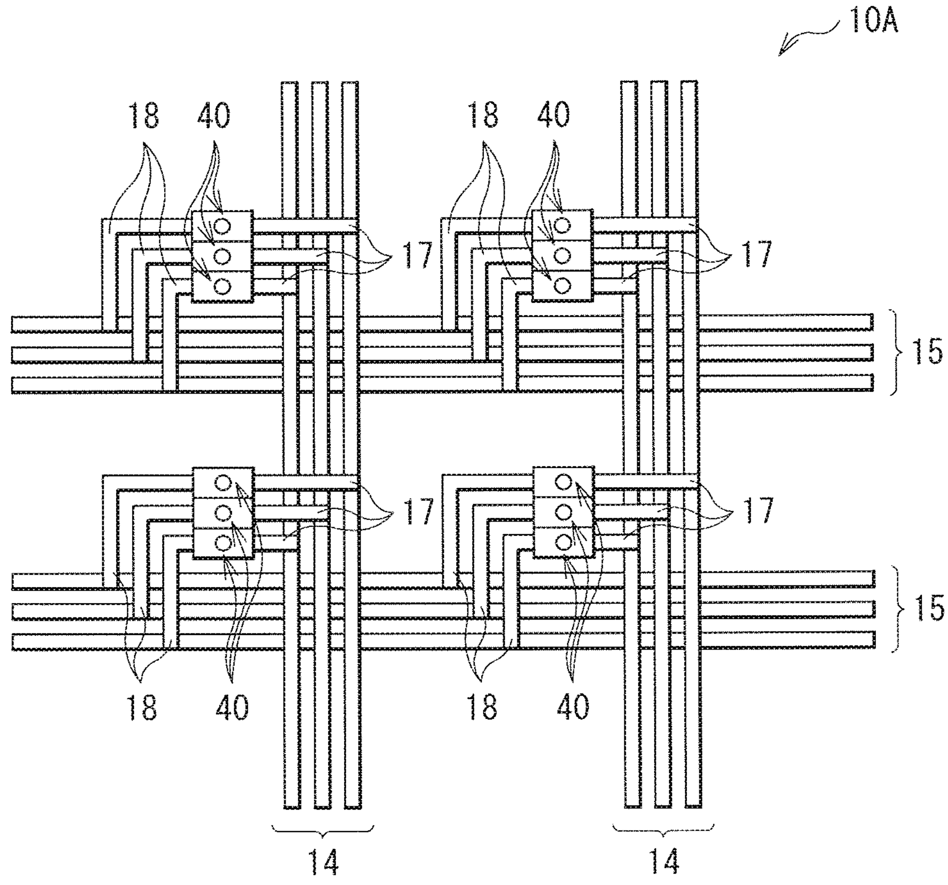
FIG. 17 is a plan view showing a modification example of a layout on the surface of the mounting substrate illustrated in FIG. 1.

In the above-described embodiment as well as the above-described modification examples 1 to 6, the light-emitting device 40 including the plurality of light-emitting elements 45 is provided one by one for each pixel, although two or more light-emitting devices 40 each including a single light-emitting element 45 may be provided for each pixel as shown in an example in FIG. 17.

Modification Example 8

In the above-described embodiment as well as the above-described modification examples 1 to 6, the light-emitting device 40 includes the plurality of light-emitting elements 45, although the light-emitting device 40 may include only a single light-emitting element 45. Further, in the above-described embodiment as well as the above-described modification examples 1 to 6, the plurality of light-emitting devices 40 are mounted on the mounting substrate 10A, although only a single light-emitting device 40 may be mounted alternatively. Moreover, in the above-described embodiment as well as the above-described modification examples 1 to 6, the plurality of light-emitting devices 40 are mounted in a matrix pattern, although they may be mounted in a line form.

Furthermore, the technology encompasses any possible combination of some or all of the various embodiments described herein and incorporated herein.

It is possible to achieve at least the following configurations from the above-described example embodiments of the disclosure.

(1) A display panel, including:

a mounting substrate including a plurality of light-emitting elements that are mounted for each pixel on a wiring substrate, the light-emitting elements having different luminescence wavelengths from each other; and a counter substrate provided in opposition to a surface, of the mounting substrate, on which the pixels are disposed, and including a light-shielding layer and a light diffusion layer, the light-shielding layer being provided on a surface, of a light transmissive substrate, that faces the pixels and having apertures at respective positions that face the light-emitting elements, and the light diffusion layer blocking up the apertures, being provided on a surface, of the light-shielding layer, that faces the pixels, being at least in contact with end edges of the respective apertures, and forming a gap together with the light-emitting elements between the light diffusion layer and the light-emitting elements.

(2) The display panel according to (1), wherein the light diffusion layer includes a light diffusion film, and a void is formed between the light diffusion film and a surface, of the light transmissive substrate, exposed within corresponding one of the apertures, or a material having a refractive index lower than a refractive index of the light transmissive substrate is filled between the light diffusion film and the surface, of the light transmissive substrate, exposed within the corresponding one of the apertures.

(3) The display panel according to (1) or (2), further including:

a wall section that surrounds the light-emitting elements included in each of the pixels; and a member that fills an internal space of the wall section, and having a refractive index that is substantially same as a refractive index of the light diffusion layer.

(4) The display panel according to any one of (1) to (3), wherein the light-emitting elements included in each of the pixels are disposed side by side in a line, and each of the apertures takes an elliptical form, or a shape similar to the elliptical form, that extends in a direction in which the light-emitting elements included in corresponding one of the pixels are arrayed.

(5) The display panel according to any one of (1) to (4), wherein a diameter of each of the apertures has a value determined by the following expression:

$$h \times \tan(\arcsin(1/n))$$

where h is a distance between corresponding one of the light-emitting elements and the light transmissive substrate, and n is a refractive index of a medium between the corresponding one of the light-emitting elements and the light transmissive substrate.

(6) The display panel according to any one of (1) to (5), further including a light reflective layer that covers a surface, of the mounting substrate, around the light-emitting elements.

(7) The display panel according to (6), further including a wall section that surrounds the light-emitting elements included in each of the pixels, wherein the light reflective layer also covers an inner side surface of the wall section.

(8) A display unit provided with a display panel and a driving circuit configured to drive the display panel, the display panel including:

a mounting substrate including a plurality of light-emitting elements that are mounted for each pixel on a wiring substrate, the light-emitting elements having different luminescence wavelengths from each other; and a counter substrate provided in opposition to a surface, of the mounting substrate, on which the pixels are disposed, and including a light-shielding layer and a light diffusion layer, the light-shielding layer being provided on a surface, of a light transmissive substrate, that faces the pixels and having apertures at respective positions that face the light-emitting elements, and the light diffusion layer blocking up the apertures, being provided on a surface, of the light-shielding layer, that faces the pixels, being at least in contact with end edges of the respective apertures, and forming a gap together with the light-emitting elements between the light diffusion layer and the light-emitting elements.

It should be understood by those skilled in the art that various modifications, combinations, sub-combinations and alterations may occur depending on design requirements and other factors insofar as they are within the scope of the appended claims or the equivalents thereof.

What is claimed is:

1. A display panel, comprising:

a mounting substrate including a plurality of light-emitting elements that are mounted for each pixel on a wiring substrate, the plurality of light-emitting elements having different luminescence wavelengths from each other; and a counter substrate provided in opposition to a surface, of the mounting substrate, on which pixels are disposed, and including a light-shielding layer and a light diffusion layer, the light-shielding layer being provided on a surface, of a light transmissive substrate, that faces the pixels and having a plurality of apertures, wherein each aperture of the plurality of apertures is at a position that faces a plurality of light-emitting elements included in a pixel corresponding to each aperture, and the light diffusion layer blocking up each of the plurality of apertures, being provided on a surface, of the light-shielding layer, that faces the pixels, being at least in contact with end edges of each of the plurality of apertures, and forming a gap together with the plurality of light-emitting elements included in the pixel corresponding to each aperture between the light diffusion layer and the plurality of light-emitting elements included in the pixel corresponding to each aperture.

2. The display panel according to claim 1, wherein the light diffusion layer comprises a light diffusion film, and a void is formed between the light diffusion film and a surface, of the light transmissive substrate of the counter substrate, that faces the pixels, exposed within corresponding one of the plurality of apertures, or a material having a refractive index lower than a refractive index of the light transmissive substrate is filled between the light diffusion film and the surface, of the light transmissive substrate, of the counter substrate, that faces the pixels, exposed within the corresponding one of the plurality of apertures.

3. The display panel according to claim 2, further comprising:

a wall section that surrounds the plurality of light-emitting elements included in each of the pixels; and a member that fills an internal space of the wall section, and having a refractive index that is substantially same as a refractive index of the light diffusion layer.

4. The display panel according to claim 1, wherein the plurality of light-emitting elements included in each of the pixels are disposed side by side in a line, and each of the plurality of apertures takes an elliptical form, or a shape similar to the elliptical form, that extends in a direction in which the plurality of light-emitting elements included in the pixel corresponding to each aperture are arrayed.

5. The display panel according to claim 1, wherein a diameter of each of the plurality of apertures has a value determined by the following expression:

$$h \times \tan(\arcsin(1/n))$$

where h is a distance between one of the plurality of light-emitting elements in the pixel corresponding to each aperture and the light transmissive substrate, and n is a refractive index of a medium between the one of the plurality of light-emitting elements in the pixel corresponding to each aperture and the light transmissive substrate.

6. The display panel according to claim 1, further comprising a light reflective layer that covers a surface, of the mounting substrate, around the plurality of light-emitting elements included in each of the pixels.

7. The display panel according to claim 6, further comprising a wall section that surrounds the plurality of light-emitting elements included in each of the pixels, wherein the light reflective layer also covers an inner side surface of the wall section.

8. A display unit provided with a display panel and a driving circuit configured to drive the display panel, the display panel comprising:

a mounting substrate including a plurality of light-emitting elements that are mounted for each pixel on a wiring substrate, the plurality of light-emitting elements having different luminescence wavelengths from each other; and a counter substrate provided in opposition to a surface, of the mounting substrate, on which pixels are disposed, and including a light-shielding layer and a light diffusion layer, the light-shielding layer being provided on a surface, of a light transmissive substrate, that faces the pixels and having a plurality of apertures, wherein each aperture of the plurality of apertures is at a position that faces a plurality of light-emitting elements included in a pixel corresponding to each aperture, and the light diffusion layer blocking up each of the plurality of apertures, being provided on a surface, of the light-shielding layer, that faces the pixels, being at least in contact with end edges of each of the plurality of apertures, and forming a gap together with the plurality of light-emitting elements included in the pixel corresponding to each aperture between the light diffusion layer and the plurality of light-emitting elements included in the pixel corresponding to each aperture.

9. The display panel according to claim 1, further comprising a light reflective layer that covers a surface, of the mounting substrate, around the plurality of light-emitting elements included in each of the pixels, wherein the light reflective layer is in the gap between the light diffusion layer and the plurality of light-emitting elements included in each of the pixels.

* * * * *